(12) United States Patent
Tsu et al.

(10) Patent No.: US 6,294,420 B1
(45) Date of Patent: *Sep. 25, 2001

(54) INTEGRATED CIRCUIT CAPACITOR

(75) Inventors: Robert Tsu, Plano, TX (US); Isamu Asano, Saitama; Shinpei Iijima, Tokyo, both of (JP); William R. McKee, Plano, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/014,724

(22) Filed: Jan. 28, 1998

Related U.S. Application Data (60) Provisional application No. 60/037,247, filed on Jan. 31, 1997.

(51) Int. Cl.$^7$ .............................................. H01L 21/8242
(52) U.S. Cl. ...................... 438/239; 438/240; 438/655; 438/396
(58) Field of Search ............................... 438/3, 240, 239, 438/655, 649

(56) References Cited

U.S. PATENT DOCUMENTS

| | | | |
|---|---|---|---|
| 5,381,302 | | 1/1995 | Sandhu et al. ................. 361/305 |
| 5,491,103 | * | 2/1996 | Ahn et al. ...................... 438/396 |
| 5,677,226 | * | 10/1997 | Ishitani .......................... 438/3 |
| 5,920,761 | * | 7/1999 | Jeon ............................... 438/3 |
| 5,981,331 | * | 11/1999 | Tsunemine ..................... 438/240 |
| 5,986,301 | * | 11/1999 | Fukushima et al. ........... 257/306 |
| 5,994,153 | * | 11/1999 | Nagel et al. ................... 438/3 |
| 5,998,250 | * | 12/1999 | Andricacos et al. .......... 438/240 |
| 6,004,839 | * | 12/1999 | Hayashi et al. ............... 438/210 |

FOREIGN PATENT DOCUMENTS 0 697 720 A1   2/1996   (EP) ........................ H01L/21/3205

OTHER PUBLICATIONS

Patent Abstracts of japan vol. 17, No. 602 (E–1482), Dec. 21, 1993, & JP 05 243487 A, (NEC Corp), Sep. 21, 1993, * Abstract * & US 5,677,226 A (NEC Corp)* col. 4, paragraph 15–paragraph 23; figures*.*

Silicon Processing for the VLSI Era, vol. 1: Process Technology; Wolf, Stanley; 1986, p. 390.*

Patent Abstracts of Japan vol. 18, No. 626 (E–1636), Nov. 29, 1994, & JP 06 244133 A, (Matsushita Electron Corp), Sep. 2, 1994, * Abstract *.

* cited by examiner

*Primary Examiner*—Eddie Lee
*Assistant Examiner*—N. Drew Richards
(74) *Attorney, Agent, or Firm*—Wade James Brady, III; Frederick J. Telecky, Jr.

(57) ABSTRACT

The present invention discloses a novel integrated circuit capacitor and a method of forming such a capacitor. The capacitor formation begins with a base electrode 18 adjacent an insulating region 26. This base electrode 18 can comprise either polysilicon or a metal. A layer 28 of a first material, such as a siliciding metal, is formed over the base electrode 18 as well as the adjacent insulating region. A self-aligned capacitor electrode 12 can then be formed by reacting the first material 28 with the base electrode 18 and removing unreacted portions of the first material 28 from the insulating region 26. The capacitor is then completed by forming a dielectric layer 16 over the self-aligned capacitor electrode 12 and a second capacitor electrode 14 over the dielectric layer 16.

15 Claims, 7 Drawing Sheets

INTEGRATED CIRCUIT CAPACITOR

This is a Non Provisional application filed under 35 USC 119(e) and claims priority of prior provisional, Ser. No. 60/037,247 of inventor Tsu, et al., filed Jun. 31, 1997.

RELATED PATENT APPLICATION

This invention is related to concurrently filed applications Ser. No. 09/014484 (TI-21973) and Ser. No. (TI-23343) which are each incorporated herein by reference.

1. Field of the Invention

This invention relates generally to semiconductor devices and specifically to an integrated circuit capacitor and a method of forming a capacitor.

2. BACKGROUND OF THE INVENTION

The increasing density of integrated circuits (e.g., dynamic random access memories) is increasing the need for materials with high dielectric constants to be used in electrical devices such as capacitors. Generally, capacitance is directly related to the surface area of the electrode in contact with the capacitor dielectric, but is not significantly affected by the electrode volume. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alter-native approach is to use a high permittivity dielectric material. Many perovskite, ferroelectric, or high dielectric constant (hereafter abbreviated HDC) materials such as $(Ba,Sr)TiO_3(BST)$ usually have much larger capacitance densities than standard $SiO_2$-$Si_3N_4$-$SiO_2(ONO)$ capacitors. Various metals and metallic compounds, and typically noble metals such as platinum and conductive oxides such as $RuO_2$, have been proposed as the electrodes for these HDC materials.

As an example, Yamamichi et al. teach a (Ba,Sr) only, (BST) based stacked capacitor with a $RuO_2/Ru/TiN/TiSix$ storage node. "An ECR MOCVD $(Ba,Sr)TiO_3$ based stacked capacitor technology with $RuO_2/Ru/TiN/TiSi_x$ storage nodes for Gbit-scale DRAMs," 1995 IEDM 119. In this process, fully planarized n-type polysilicon plugs were fabricated. Fifty nanometer titanium and 50 nm TiN layers were then deposited using a Ti metal target. This double layer was treated by RTA in $N_2$ at 700° C. for 30 seconds to form a $TiSi_x$ silicide layer. Furthermore, a 50–100 nm metal Ru layer was inserted between the $RuO_2$ and BST deposition.

Unfortunately, the materials which are compatible with HDC dielectrics tend to be difficult to process. For example, Yamamichi et al. teach only a simple block structure of $RuO_2$. Much engineering effort has gone into processing materials such as silicon, oxides and nitrides but less common materials have been the subject of less investigation. Accordingly, techniques to deposit and etch materials other than those commonly used are not well known. As a result, it is presently difficult to use HDC materials in anything but the simplest structures.

SUMMARY OF THE INVENTION

The present invention provides an integrated circuit capacitor which can be used in a wide variety of devices including dynamic random access memories (DRAMs). As DRAM dimensions continue to shrink and the density corresponds to increase by factors of four, the storage cell is getting small while the required storage charge remains about the same. Conventional oxynitride (N/O) dielectrics have smaller storage charge per unit area than high dielectric constant materials such as $Ta_2O_5$, $Ba_{1-x}Sr_xTiO_3(BST)$, $SrTiO_3$, and $Pb_{1-x}Zr_xTiO_3(PZT)$. Thus, metal-insulator-metal (MIM) capacitors using the high dielectric constant materials have been proposed for supplying high storage charge density in a small storage cell. The present invention proposes self-aligned MIM capacitor formation which can be used in conjunction with high dielectric constant materials.

The capacitor formation begins with a base electrode material adjacent an insulating region. This base electrode material can comprise polysilicon or a metal. A layer of a first material, such as a siliciding metal, is formed over the base electrode material as well as the adjacent insulating region. A self-aligned capacitor electrode can then be formed by reacting the first material with the base electrode material and removing unreacted portions of the first material from the insulating region. The capacitor is then completed by forming a dielectric layer over the self-aligned capacitor electrode and a second capacitor electrode over the dielectric layer. Each of the dielectric layer and/or the second capacitor electrode may be aligned with the storage node but do not have to be.

In one specific embodiment, a bottom electrode formed from doped polysilicon is patterned using conventional photoresist and etching. A conformal silicide layer is formed along the bottom electrode (or storage node in a DRAM) through silicidation using rapid thermal anneal (RTA) following a chemical vapor deposition (CVD) metal deposition. The non-silicided metal layer is selectively etched away. A nitridation process using $N_2$ or $NH_3$ plus rapid thermal nitridation (RTN) is applied to form a metal nitride conductive layer along the bottom electrode. During this process, a thin SiON layer may consequently be formed on the surface of any adjacent oxide regions. The dielectric and top plate are sequentially deposited on the bottom electrode to form the self-aligned MIM capacitor.

The resultant structure provides a novel integrated circuit capacitor. In one embodiment, this capacitor includes a semiconductor region, a silicide layer disposed on the semiconductor region, a conductive nitride layer disposed on the silicide layer, a dielectric layer disposed on the silicide layer, and a conductive layer disposed on the dielectric layer. A second embodiment capacitor has a first electrode which includes a semiconductor region and a conductive nitride layer disposed on the semiconductor region. The conductive nitride includes a metal silicide.

The present invention discloses a unique process for forming a self-aligned capacitor plate. In addition, this self-aligned electrode has good oxidation resistance and a high work function. For example, conductive nitride electrodes have better oxidation resistance and higher work function than pure metal electrodes. These conductive nitrides can be used as direct capacitor electrodes or electrode diffusion barriers, which are typically needed for BST or PZT deposition. In particular, this self-aligned conductive nitride electrodes are suitable for the $Ta_2O_5$.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The structure of the present invention will be described first. A method of fabricating a simple structure will then be described. Finally, the present invention will be described in terms of one specific application—the dynamic random access memory.

Figure 1:
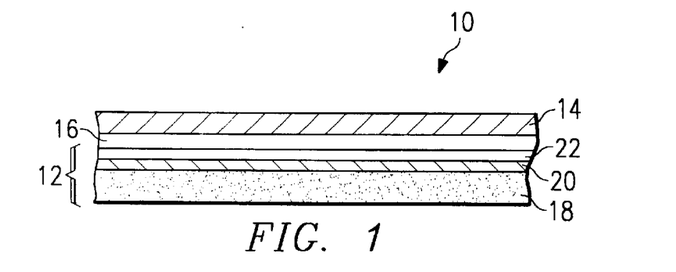
FIG. 1 is a cross-sectional view of a first embodiment stacked capacitor of the present invention.

FIG. 1 illustrates a simplified view of a first embodiment integrated circuit capacitor 10 of the present invention. It is noted in viewing FIG. 1, as well as subsequent figures, that no attempt has been made to draw the various levels to scale. Specific dimensions will be provided in the written description when warranted.

Capacitor 10 includes a first electrode 12, a second electrode 14 and a dielectric layer 16. As with any capacitor, dielectric layer 16 separates first and second electrodes 12 and 14. The capacitance of the cell can be expressed as $C_s/A = \epsilon_0 \epsilon_r / t$, where $C_s$ is the storage cell capacitance, A is the total surface area of the capacitor, t is the dielectric film thickness, and $\epsilon_0$ and $\epsilon_r$ stand for vacuum and relative permittivities, respectively. Prior art capacitors have used a high dielectric constant (k) layer 16. In this context, a high dielectric constant material is defined as one which has a dielectric constant of about 50 or greater. Any material which has this property could be encompassed. Specific materials will also be disclosed. When a specific material is discussed it is preferably a high dielectric material but does not need to be.

Examples of high dielectric materials include $Ta_2O_5$, BST, $SrTiO_3$, and PZT. These high dielectric constant materials are typically grown by metal-organic chemical vapor deposition (MOCVD) in oxygen ambient. As a result, the bottom electrode must be resistant to oxidation. Since a conventional polysilicon bottom electrode 12 will form a $SiO_2$ layer if a high-k dielectric film 16 is deposited directly, a metal or conductive nitride electrode is typically included with the use of the high-k dielectrics.

As an example, one prior art paper has proposed using $Ta_2O_5$ for the storage dielectrics with a CVD tungsten plate on top of polysilicon as the bottom electrode. T. Kaga et al., "A 0.29 $\mu m^2$ MIM-CROWN Cell and Process Technologies for 1-Gigabit DRAMs," 1994 IEDM 927. The tungsten electrode is oxidized at temperatures above 400° C., Hence, this material is not a good candidate for a high-k dielectric electrode since it will oxidize during dielectric formation. Other CVD metals such as platinum, palladium and aluminum or conductive nitrides such as TaSiN, TiSiN, WN, TIN, and TiAlN deposited on polysilicon have also been proposed for the bottom electrode. But these materials need additional patterning and etching processes. Furthermore, the above CVD processes are either not available or mature currently. In order to have an easy integrated electrode and robust processes, we propose a self-aligned bottom electrode process for integrated circuit capacitors which can be used with the high-k dielectrics.

To accomplish this goal, FIG. 1 illustrates a first electrode 12 which comprises a multilayer structure. For example, first electrode 12 can comprise semiconductor region 18, metal layer 20 and conductive diffusion-barrier layer 22.

In the preferred embodiment, the semiconductor region 18 comprises silicon although other materials are possible. Polysilicon tends to be the preferred material since much know-how exists relating to the processing of silicon structures. Other materials could alternatively be used. In an alternate embodiment, semiconductor region 18 may be replaced by a metal region. One such embodiment is described in further detail in co-pending application Ser. No. 09/014484(TI-21973).

Layer 20 preferably comprises a silicide layer. Any number of materials can be used including tantalum silicide ($TaSi_x$), titanium silicide ($TiSi_x$), aluminum silicide ($AlSi_x$), tungsten silicide ($WSi_x$), molybdenum silicide ($MoSi_x$), Cobalt Silicide ($CoSi_x$), and metal alloy silicides. Layer 20 can range in thickness from about 3 nm to about 100 nm. A thinner layer tends to add less stress so a thickness of at least about 3 nm is typically used.

In the preferred embodiment, electrode layer 22 comprises a conductive nitride layer. Materials which can be used for this layer include Ta—Si—N, Ti—Si—N, W—Si—N, Ti—N, Mo—Si—N, Ti—Al—N, W—N, Mo—N, and metal alloy silicon nitrides. (For the purposes of this patent, the dashes included within the chemical notations are used to denote the fact that each of the elements in the compound may not be present in equal portions. One of ordinary skill in the art could deduce the proper compound without undue experimentation.) Other embodiments can utilize other barrier layer 22 materials including other ternary (or greater) amorphous nitrides (e.g., Ta—B—N, Ti—B—N), exotic conductive nitrides (e.g., Zr-nitride, Hf-nitride, Y-nitride, Sc-nitride, La-nitride and other rare earth nitrides, n-deficient Al-nitride, doped Al-nitride, Mg-nitride, Ca-nitride, Sr-nitride, Ba-nitride), or alloys of the these exotic conductive nitrides with common silicon processing materials such as TiN, GaN, Ni-nitride, Co nitride, Ta-nitride and W-nitride. In addition, noble metal insulator alloys such as Pt—Si—N, Pd—Si—O, Pd—B—(O,N), Pd—Al—N, Ru—Si—(O,N), Ir—Si—O, Re—Si—N, Rh—Al—O, Au—Si—N, may also constitute electrode layer 22 and Ag—Si—N. Further, barrier layer 22 can comprise multiple layers including combinations of the above materials.

In the embodiment described above, the bottom electrode 12 comprises a polysilicon/silicide/conductive nitride structure. In an alternate embodiment, which is not illustrated, bottom electrode 12 can comprise a metal/conductive nitride structure. The silicidation and nitridation processes described below will form self-aligned electrodes with beginning polysilicon or metal electrodes. It is also noted that the nitridation process (described below) could consume all the silicide 20 depending on silicide thickness and nitridation conditions. In that embodiment, the final structure 12 would comprise a semiconductor (or metal) layer 18 and a conductive nitride layer 22 (without the intervening metal layer 20).

If electrode 18 is formed from metal, materials such as tungsten, titanium, tantalum, molybdenum, cobalt, zirconium, ruthenium, or metal alloys or silicides are preferred. For metal silicides, tungsten tends to be preferred since it is currently being used in other processes and has better oxidation resistance and a larger work function than titanium or tantalum. In any event, either titanium, tantalum, or any of the other materials can still be used.

One of the advantages of the capacitor of the present invention is that it can be fabricated with a large number of dielectric materials 16. While standard oxide and nitride materials can be used, the present invention can also be used with high dielectric constant materials including tantalum pentoxide ($Ta_2O_5$), barium strontium titanate or simply BST ($Ba_{1-x}Sr_xTiO_3$), strontium titanate ($SrTiO_3$) and lead zirconium titanate or simply PZT ($Pb_{1-x}Zr_xTiO_3$). As noted above, these materials are not compatible with simply silicon structures. But these materials can be used with the structure described herein.

Top electrode 14 can comprise just about any conductive material. The only criteria is that the electrode material be physically (e.g., adhesively, thermally) compatible with dielectric material 16. For example, electrode 14 can comprise silicon (e.g., polysilicon), a metal (e.g., aluminum, copper, palladium, platinum, ruthenium, gold, silver, tantalum, titanium, molybdenum, tungsten), a silicide (e.g., $TaSi_x$, $TiSi_x$, $AlSi_x$, CoSix, $WSi_x$, $MoSi_x$, an alloy silicide), a conductive nitride (e.g., Ti—N, Ti—Al—N, Ta—Si—N, W—Si—N, W—N, Mo—N, Ru—N, Sn—N, Zr—N), a conductive oxide (e.g., $RuO_2$, SnO, ZO, IrO), or other conductive materials (e.g., a carbide such as tantalum carbide, a boride such as titanium boride).

Figure 2A:
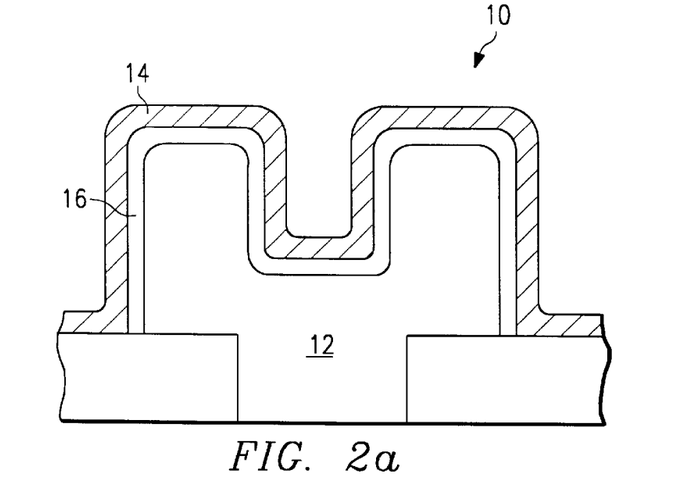
FIGS. 2a–2c are cross-sectional views of alternate embodiment capacitors.
Figure 2B:
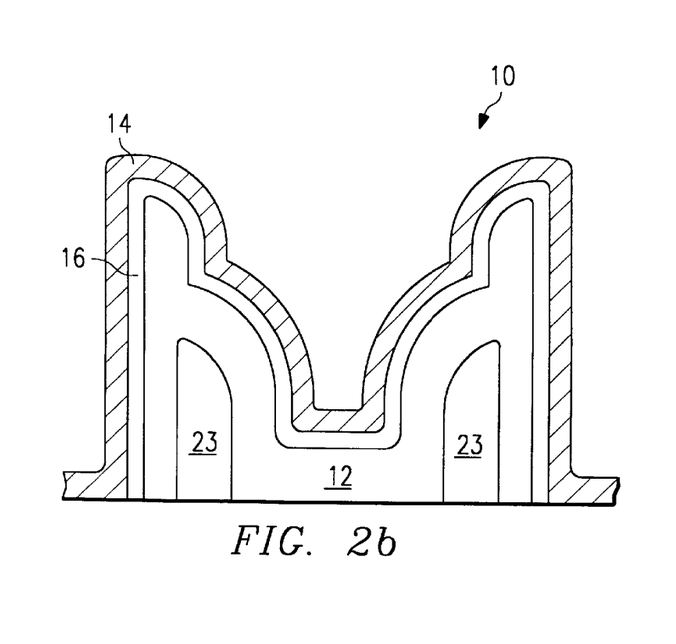
Figure 2C:
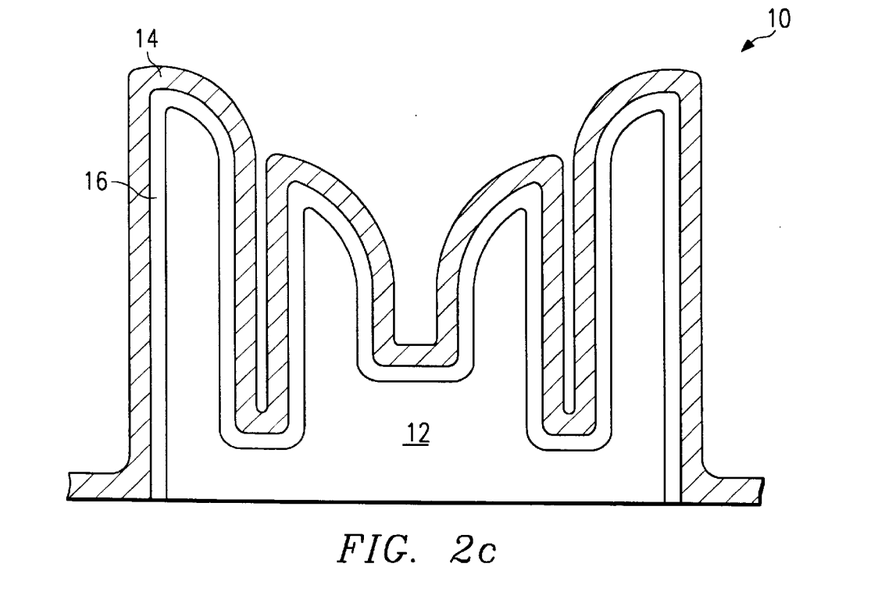

One of the advantages of the present invention is that any of a variety of structures can be easily fabricated. While the bottom electrode 12 can be a simple planar structure, other structures such as crowns and other 3-D storage shelf shapes can also be formed. In this context, a non-planar structure is meant to encompass structures other than a simple "table top". FIGS. 2a–2c illustrate three of such structures as examples. FIG. 2a illustrates a simple crown structure with a cylindrical bottom electrode 12. FIGS. 2b illustrates a capacitor which includes a spacer 23 and FIG. 2c illustrates a crown capacitor with concentric cylinders. These figures have been included to demonstrate that the present invention can be used with a wide range of storage node shapes. Other storage node shapes such as fins are also possible.

A process for forming the capacitor of the present invention will now be described with reference to FIGS. 3a–3f. While a simple stacked capacitor will be illustrated, it is noted that any number of structure shapes can also be formed using the same steps.

Figure 3A:
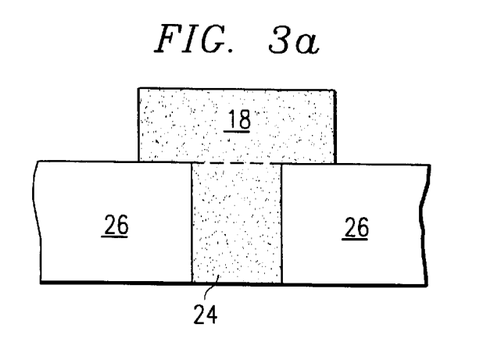
FIGS. 3a–3g are cross-sectional views illustrating the formation of an integrated circuit capacitor of the present invention.

Referring now to FIG. 3a, a plug 24 is formed through conventional patterning and etching. The plug 24 material can be doped polysilicon or a metal. For purposes of discussion, a polysilicon plug 24 will be assumed for the description that follows. The nature of the plug is not critical, however, and can be eliminated completely. For example, the same material used to make the storage node may also fill the hole.

In the example of FIG. 3a, polysilicon plug 24 is formed within an insulating layer 26. In the preferred embodiment, insulating layer 26 comprises a oxide layer formed through the decomposition of tetraethyloxysilane (TEOS) on a boro-phosphosilicate glass (BPSG) layer. The TEOS process is desirable since the resultant oxide tends to have better oxide properties than BPSG in terms of breakdown, leakage, and density. Hence, the TEOS oxide is deposited on top of BPSG.

Figure 3B:
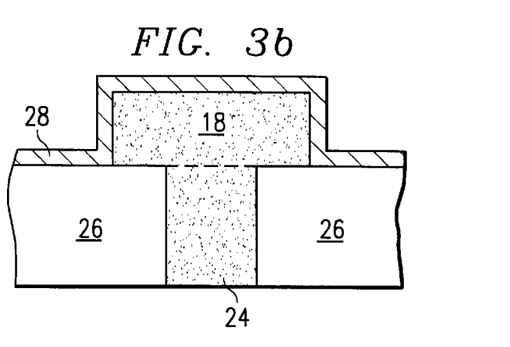

Referring next to FIG. 3b, metal layer 28 is formed over the structure. In the preferred embodiment, a CVD metal layer 28 is deposited over the entire surface of electrode 18 as well as insulating region 26. In the preferred embodiment, metal layer 28 should be a material that is relatively good for oxidation resistance and has a high work function. Preferred materials would include tantalum, titanium, aluminum, tungsten, molybdenum, cobalt, titanium aluminum, and metal alloys.

Figure 3C:
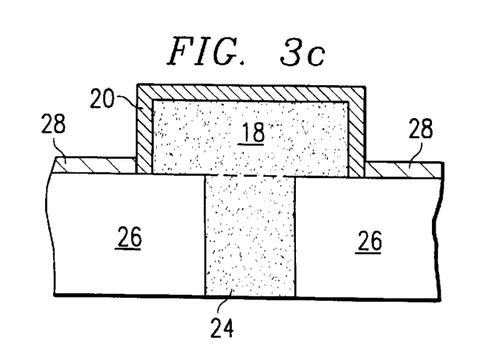
Figure 3D:
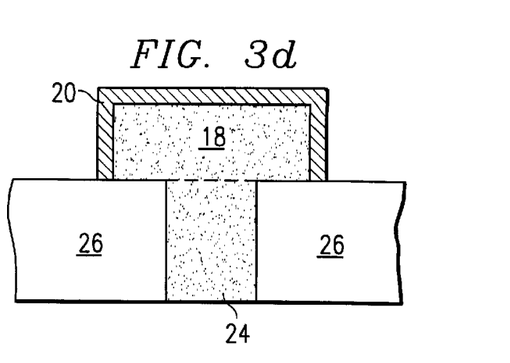

A silicidation process can then be performed as illustrated in FIG. 3c. The process can be performed by furnace anneal or RTA (rapid thermal anneal) in an inert gas (e.g., Ar, $N_2$, $H_2/N_2$, He) ambient to form a metal silicide 20 along portions of bottom electrode 18. The non-silicided metal layer 28 on top of insulating region 26 will be selectively etched away so that the metal silicide layer 20 remains intact as shown in FIG. 3d.

Figure 3E:
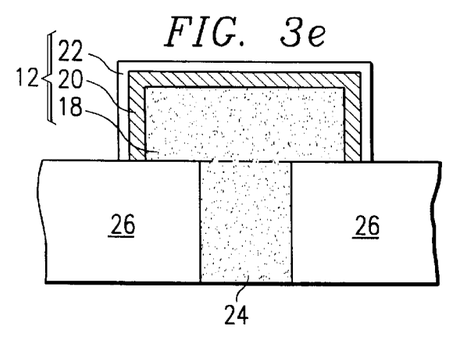

As illustrated in FIG. 3e, a nitridation process using $N_2$ or $NH_3$ is applied to the metal silicide layer 20 to form a conductive nitride layer 22. This process may optionally include a rapid thermal nitridation (RTN) step. Conductive nitride layer 22 is preferred since it has a much better oxidation resistance and higher work function than pure metals and metal silicides.

If a metal base electrode 18 is used, it can be nitrided using a nitridation process by $N_2$ or $NH_3$ plasma plus RTN to form metal nitride 22 (without intervening layer 20). This metal nitride 22 will also have better oxidation resistance and a higher work function than a pure metal electrode. In this alternate embodiment, conductive nitride layer 22 is formed as part of the bottom electrode 12 instead of the metal silicide nitride formed in the case of using the polysilicon base electrode 18. Further examples of metal electrodes are provided in co-pending application Ser. No. 09/014484 (TI-21973).

The self-aligned electrode 12 is formed after the nitridation of the metal base electrode 18 or metal silicide intervening layer 20. An advantage of this process is that the bottom electrode 12 is formed self-aligned with the original base electrode 18. Since well known materials such as silicon can be used as the base electrode, this electrode can take a variety of shapes and sizes. This advantage will be explored in more detail below with reference to DRAM devices.

A silicon-oxide-nitride (SiON) insulating layer (not shown) may be formed on the surface of the oxide insulating region 26 during the nitridation process. Since SiON is not conductive and any plasma damage will be repaired by RTN, any SiON layer should have no effect on the cell array. Specifically, the SiON layer should not induce leakage in the capacitor.

Figure 3F:
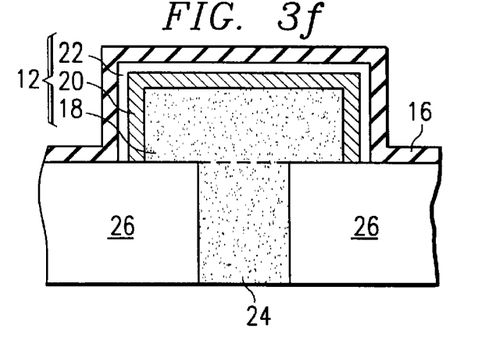

Referring now to FIG. 3f, dielectric layer 16 is formed. In the preferred embodiment, a CVD (e.g., PECVD) dielectric layer 16, which can be $Ta_2O_5$ for instance, is deposited along surface of the insulating region 26 and bottom electrode 12. As discussed above, other dielectric materials such as BST or PZT can also be used. FIG. 3f illustrates dielectric layer 16 extending beyond the limits of storage node 12. It is noted that this feature is not necessary.

Figure 3G:
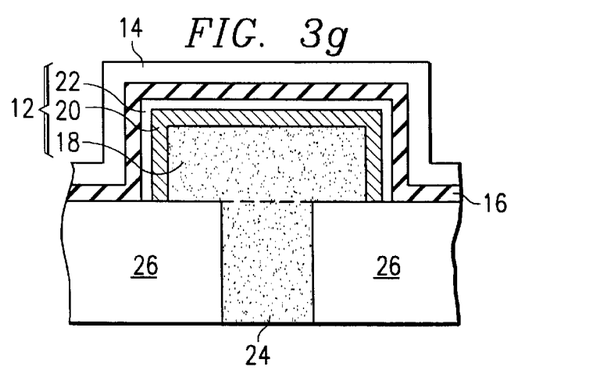

An upper electrode 14 can next be formed over capacitor dielectric 16 to complete the capacitor as shown in FIG. 3g.

This electrode layer 14 can be formed by CVD, plasma enhanced CVD, or sputtering, for example. As discussed above, a large number of materials can be used. A multilayer structure can also be used. Electrode layer 14 can extend beyond dielectric layer 16 and/or storage n ode 12 or can be aligned with the underlying layers.

Three test structures were built using the teachings of the present invention. Specific process details for these three embodiments are provided in Table 1. These examples are intended to provide general parameters for some of the key process steps in capacitor fabrication. Other steps, as described elsewhere or otherwise known, will be used or substituted in the actual formation of production devices.

TABLE 1

| Process Step | Embodiment 1 | Embodiment 2 | Embodiment 3 |
| --- | --- | --- | --- |
| Provide wafer | n-type Si wafer | n-type Si wafer | n-type Si wafer |
| Form storage node | polysilicon | polysilicon | polysilicon |
| Metal layer | sputter W (deposited at room temp.) | sputter W (deposited at room temp.) | CVD of $WSi_4$ |
| Silicidation | heat at about 650° C. to 750° C. for 1–10 min. | heat at about 650° C. to 750° C. for 1–10 min. | NA |
| Nitridation (in general, RTN has temperature of 700–850° C., pressure of 100–760 torr for 1–5 minutes | none | RTN in $NH_3$ at 760 torr and 800° C. for about 2 minutes | $N_2$ plasma at about 400° C. plus RTN in $NH_3$ at 760 torr and 800° C. for about 2 minutes |
| $Ta_2O_5$ deposition at about 400° C. | about 15 nm | about 15 nm | about 15 nm |
| $O_2$ Plasma | about 300 W, 400° C. for 15 min | about 300 W, 400° C. for 15 min. | about 300 W, 400° C. for 15 min. |
| Ozone Anneal | about 270 ° C. for about 10 min. | about 270° C. for about 10 min. | about 270° C. for about 10 min. |
| Effective oxide thickness | 5.9 nm | 4.45 nm | 3.44 nm |
| Critical voltages at a critical leakage current density of $10^{-3}$ $A/cm^2$ | +Vc = 0.85V −Vc = 3.8V | +Vc = 1.23V −Vc = 2.4V | +Vc = 1.24V −Vc = 1.94V |

Each of the test capacitors described in Table 1 was fabricated with a gold top electrode which was deposited using a shadow mask. Data taken from these devices indicated that the most critical parameters are effective oxide thickness ($T_{eff}$) and positive critical voltage. The targets are low $T_{eff}$ (large cell capacitance) and high critical voltages. The critical voltage should be greater than one volt or half of memory array voltage.

The method and structure of the present invention provide an integrated circuit capacitor which can be used in a wide variety of applications. For example, the capacitor of the present invention can be used in a dynamic random access memory (DRAM), an analog-to-digital (A/D) converter, a digital-to-analog (D/A) converter, or just about any other integrated circuit chip. To demonstrate some of the advantageous features, the present invention will be further described in the context of a DRAM.

Figure 4A:
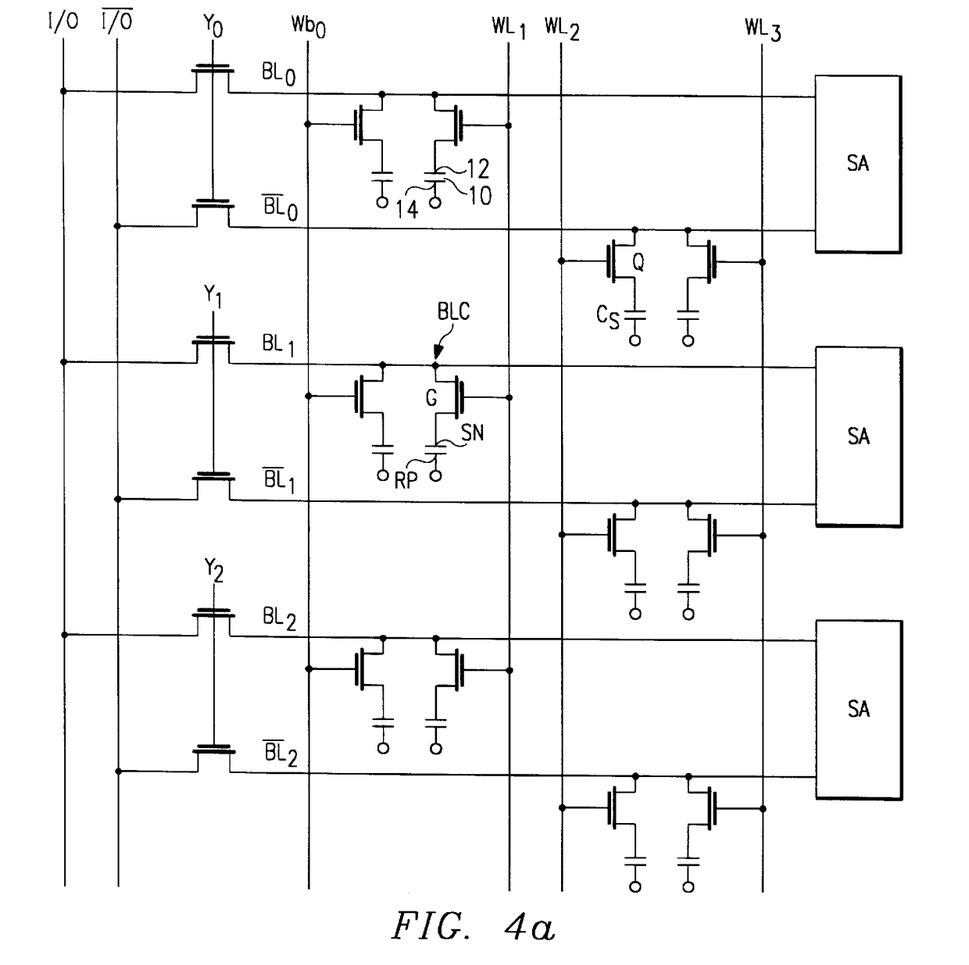
FIGS. 4a–4c are diagrams of a DRAM circuit which can utilize the capacitor of the present invention.

A simplified schematic diagram of a DRAM array is illustrated in FIG. 4a. As shown, a plurality of memory cells can be formed in an array of rows and columns. FIG. 4a illustrates only six bit lines BL and four word lines WL in what in actuality would likely be a much larger array. The pass transistor Q of each memory cell has a gate G coupled to a word line WL and a source/drain region BLC (for bit line contact) coupled to a bit line BL. The transfer gate G of one pass transistor Q will be electrically coupled to the word line WL for a number of other pass transistors.

Although not shown, the memory cells can be addressed by external row and column address signals which are applied to row and column address buffers, respectively. The row address signals are then applied to row decoders and the column address signals are applied to column decoders. The signals generated by the row and column decoders are then applied select the bit line and word line which is being accessed.

FIG. 4a also illustrates some of the peripheral circuitry which would be included with a memory array. For example, each pair of bit lines BL and BL(bar) is coupled to a sense amplifier SA The bit lines BL and BL(bar) are also coupled to input/outline lines I/O and I/O(bar) through select transistors $Y_0$–$Y_2$. Other peripheral circuitry such as the row decoders, column decoders, address buffers, I/O buffers and so on are not illustrated here. For the purposes of this invention, the memory cell and fabrication method are independent of the memory architecture.

As an example, the memory array can be designed as an asynchronous memory or as a synchronous memory. A synchronous memory can be timed with an internal clock (not shown) or an external clock (not shown). The device can have a single external data terminal or multiple external data terminals (i.e., wide word). The array can store a total of 4 megabits, 16 megabits, 64 megabits, 256 megabits, one gigabit of information, or more.

Figure 4B:
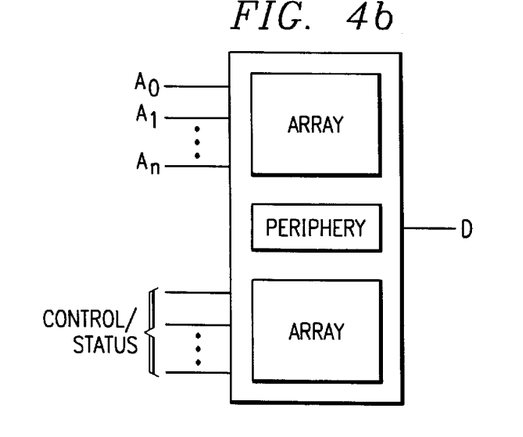

A simplified block diagram of a memory device is shown in FIG. 4b. The internal device circuitry includes an array and peripheral circuitry. The array may be divided into a number of blocks depending upon the device architecture. Sense amplifiers may be interleaved within the array blocks.

Several external terminals are illustrated in FIG. 4b. Address terminals $A_0, A_1, \ldots, A_n$ are provided for receiving row and column addresses. These terminals may be multiplexed (i.e., a first address is applied at a first time and a second address applied at a second time). A single data terminal D is also illustrated. This terminal may comprise an input, an output or an input/output. Other data terminals may also be included. For example, a wide word device will have multiple data terminals. In general, these terminals are provided for receiving input signals from circuitry (not shown) external of the array and for providing output signals to circuitry (not shown) external of the array.

FIG. 4b also illustrates a number of control/status signals. These signals are used to operate the memory device. For example, an asynchronous memory device may be operated by applying chip select, row address strobe and column address strobe signals. Other signals may indicate whether a read or write operation is being performed. In a synchronous device, one of the control signals may be a clock signal. Status signals may provide information about the device to the external system For example, the device may include a signal indicating whether a refresh operation is taking place or which portion of the array is being accessed.

Figure 4C:
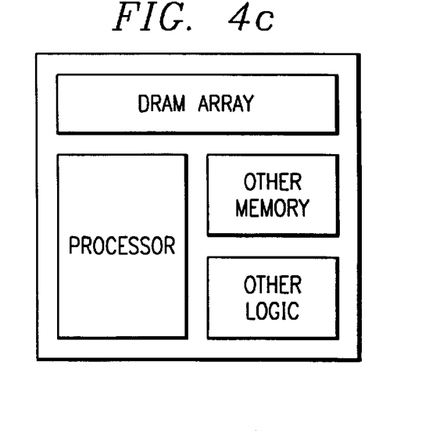

A memory array of the present invention could also be embedded in a larger integrated circuit device. An embedded memory is a memory array and its associated control circuitry on the same integrated circuit as a substantial amount of logic. FIG. 4c has been included to illustrate a simple block diagram of an embedded memory. In this example, a DRAM array is included along with a processor (e.g., microprocessor, digital signal processor, specialty processor, microcontroller), another memory array (e.g., SRAM, nonvolatile memory such as EPROM, EEPROM, flash memory, PROM, ROM, another DRAM array) and other logic circuitry. These particular blocks have been chosen to illustrate the wide variety of other logic which could be included. Any combination of the devices could be included.

An exemplary method of forming a DRAM device will now be described with respect to FIGS. 5a–5j. This method is included to illustrate how the present invention could be easily incorporated in a DRAM process flow.

Figure 5A:
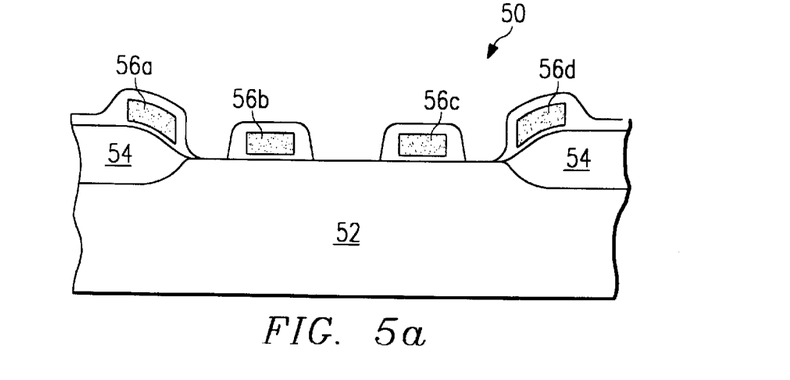
FIGS. 5a–5j are cross-sectional views illustrating one process flow for forming a DRAM which utilizes the capacitor of the present invention.

Referring now to FIG. 5a, a DRAM device 50 will be formed in a semiconductor substrate 52. FIG. 5a illustrates field isolation regions 54 and four word line/pass gates 56. While illustrated with field isolation 54, it is also noted that other isolation techniques such as trench isolation can be used. Pass transistors 56b and 56c will form the gates of the two memory cells which will be illustrated in these drawings. Word lines 56a and 56d, on the other hand, will serve as the pass transistors for gates in other rows of the device.

Figure 5B:
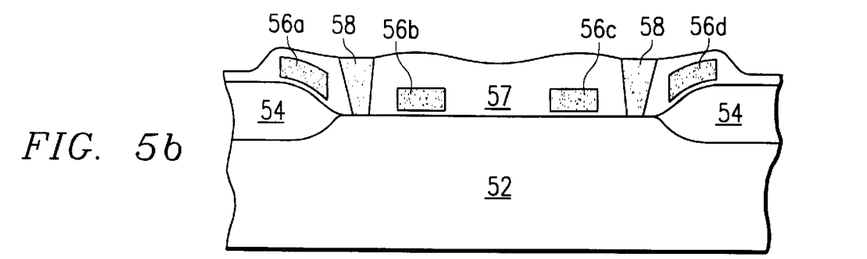

Referring now to FIG. 5b storage plate plugs 58 are formed. The regions 58 are analogous to regions 24 illustrated in FIGS. 3a through 3g. Regions 58 can be formed, for example, by depositing a layer of oxide material 57 over the word lines (which may be surrounded by nitride regions which are not shown) and then etching contact holes through the oxide 57. As described above the plugs 58 can be formed from polysilicon or a metal.

Figure 5C:
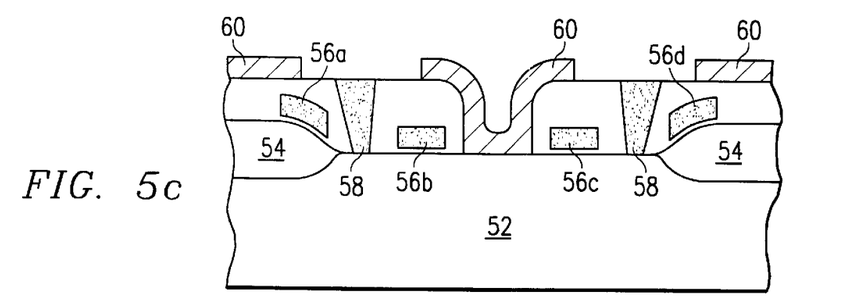

Bit line regions 60 are formed in FIG. 5c. As illustrated, in this example, the two memory cells being fabricated will share a single bit line (see FIG. 4a for the electrical schematic). While it is not critical to this invention, the bit line may comprise any conductive material such as silicon or a metal.

Figure 5D:
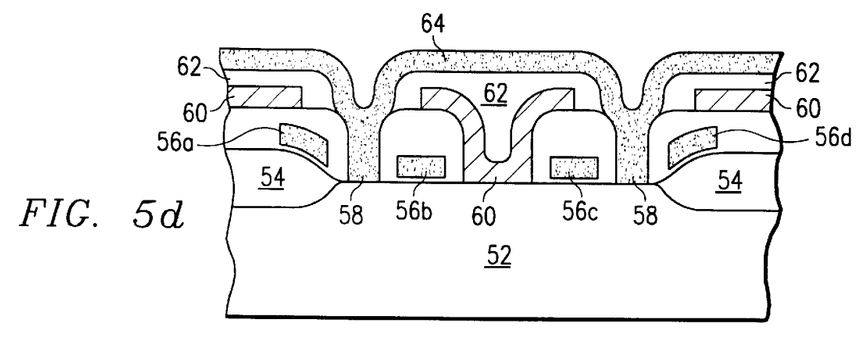

Referring now to FIG. 5d, formation of the storage node of the capacitors is continued. An insulating layer 62 is formed over the bit lines 60. Using standard patterning and etching techniques, a contact hole is formed through insulating layer 62 to expose plug 58. Subsequently a second conductive layer 64 is formed over the insulating layer and so as to contact plugs 58. The conductive layer 64 preferably comprises polysilicon or a metal as described above.

Figure 5E:
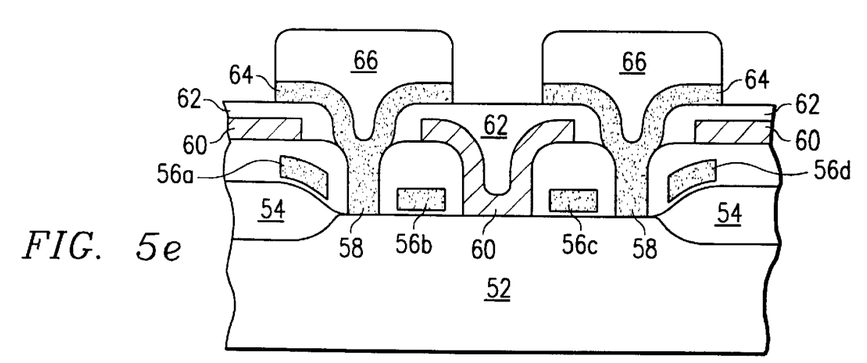

Referring now to FIG. 5e a dummy masking layer 66 is formed over the conductive layer 64. Using standard patterning and etching techniques, masking layer 66 is patterned so as to protect the portion of layer 64 which will become part of the storage node. Masking layer 66 and conductive layer 64 are then etched to create the portion of the storage node structure illustrated in FIG. 5e.

Figure 5F:
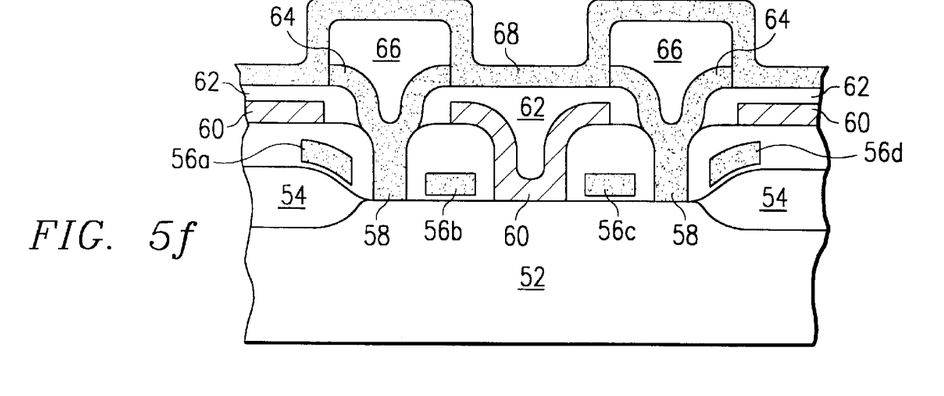
Figure 5G:
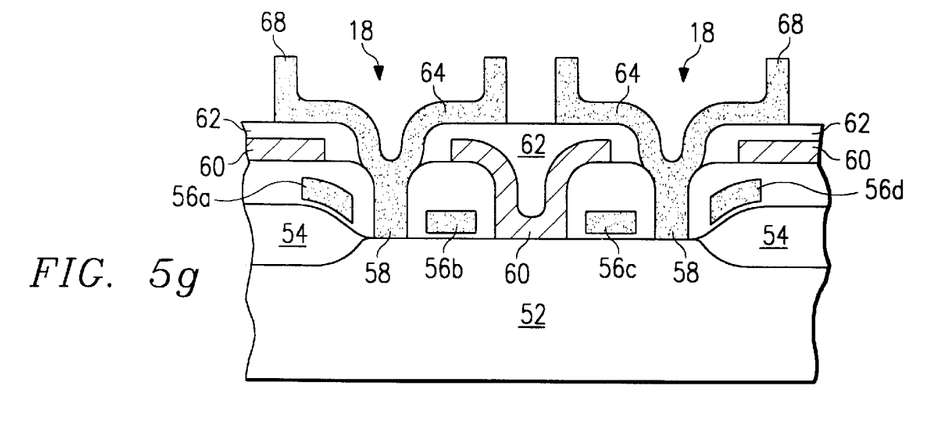

Referring now to FIG. 5f, a second conductive layer 68 is formed over the structure. In the preferred embodiment, layer 68 comprises a conformally deposited polysilicon material which will surround dummy layer 66. The layer 68 can then be anisotropically etched so as to leave side wall along the dummy layers 66. After the dummy layer 66 is removed, a cylindrical storage node 18 will remain as illustrated in FIG. 5g. Storage node 18, which comprises conductive regions 58, 64 and 68, is analogous to the base electrode 18 illustrated in FIGS. 1–3.

Using the prior art processing techniques, a standard ONO dielectric could then be formed over the storage node 18 to serve as capacitor dielectric. Alternatively, one could attempt to use a high dielectric constant material such as tantalum pentoxide, BST, or PZT. As discussed above, however, these materials are not compatible with the silicon. Electrode materials, such as platinum, which are compatible with high-k dielectrics, however would be difficult to form on the silicon structure. The self-aligned technique of the present invention will solve these problems.

Figure 5H:
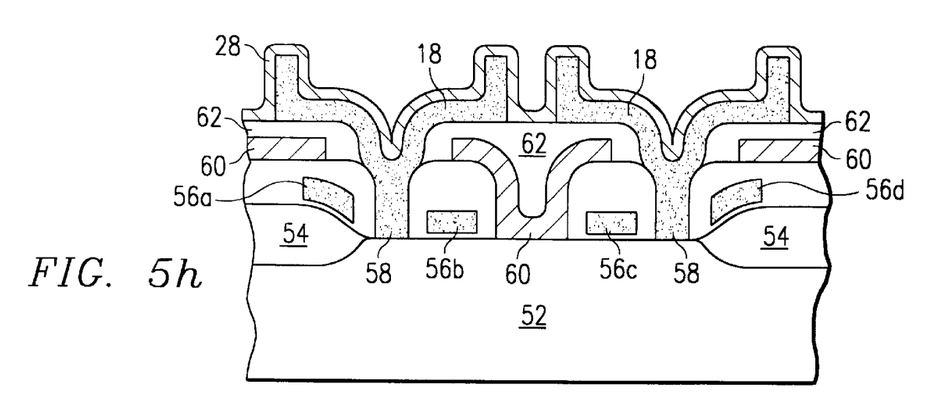
Figure 5I:
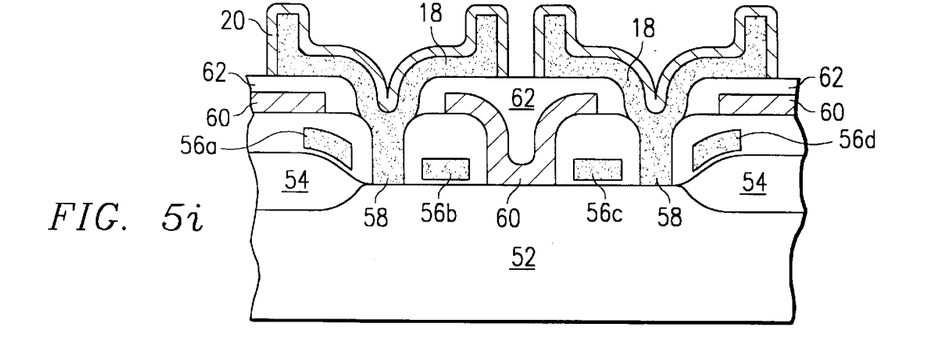

The remaining steps in forming the integrated circuit capacitor are the same as those described above with respect to FIGS. 3a–3g. Referring now to FIG. 5h, a metal layer 28 is formed over the device 50. Any of the materials described above with respect to FIG. 3 can be used. As illustrated in FIG. 5i, a self-aligned silicide process can then be performed. In other words, the conductive layer 28 is reacted with the storage node 18 but not with the intervening isolation regions. The unreacted portions of layer 28 can then be removed leaving only a metal silicide layer 20 surrounding the storage node as illustrated in FIG. 5i.

Figure 5J:
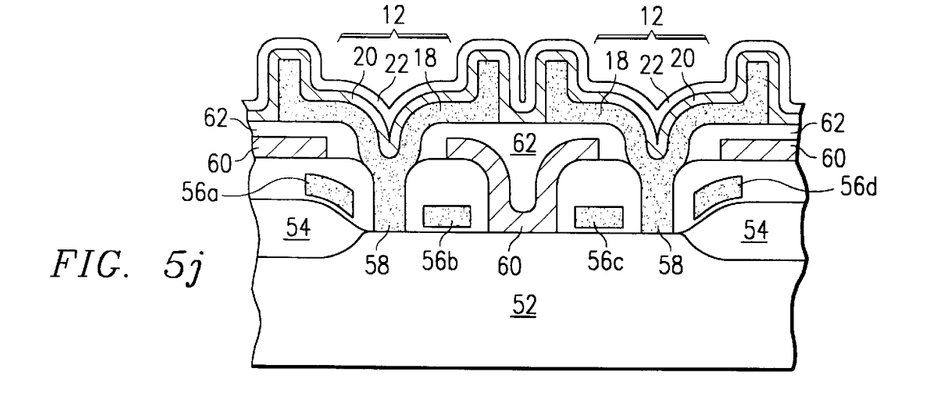

Following the formation of layer 20, a conductive nitride layer 22 can be formed as was described with respect to FIG. 3e. Alternatively, a metal storage node 18 could have been used and directly nitrided as also described previously. After the storage node 12 is complete, a dielectric layer 16 can be formed as was described with respect to 3f and then a top conductor 14 can be formed as was described with respect to FIG. 3g. The final structure of the DRAM capacitors is illustrated in FIG. 5j.

It is noted that a number of additional steps will be required before the DRAM device is completed. Since these steps are not critical to the present invention, they will not be described here beyond the acknowledgment of their existence.

The fabrication process described with respect to FIG. 5a–5j demonstrates the value of the method of the present invention. As was shown, the self-aligned storage node formation was performed after a standard silicon storage node process. Each of the patents listed in Table 2 describe a process for forming a stacked capacitor DRAM device. The present invention can be incorporated with any of these process flows (as well as innumerable other process flows). Accordingly, each of the methods described in the following patents are incorporated herein by reference.

TABLE 2

| Patent Number | Issue Date | Inventor | Assignee | Title |
| --- | --- | --- | --- | --- |
| 5,480,826 | 1/2/96 | Sugahara et al. | Mitsubishi | Method of Manufacturing Semiconductor Device having a Capacitor |
| 5,491,103 | 2/13/96 | Ahn et al. | Samsung | Method for Manufacturing a Capacitor Structure of a Semiconductor Memory Device |
| 5,491,104 | 2/13/96 | Lee et al. | ITRI | Method for Fabricating DRAM Cells having Fin-Type Stacked Storage Capacitor |

TABLE 2-continued

| Patent Number | Issue Date | Inventor | Assignee | Title |
|---|---|---|---|---|
| 5,494,841 | 2/27/96 | Dennison et al. | Micron | Split-Polysilicon CMOS Process for Multi-Megabit Dynamic Memories Incorporating Stacked Container Capacitor Cells |
| 5,498,562 | 3/12/96 | Dennison et al. | Micron | Semiconductor Processing Methods of Forming Stacked Capacitors |
| 5,501,998 | 3/26/96 | Chen | ITRI | Method for Fabricating Dynamic Random Access Memory Cells having Vertical Sidewall Stacked Storage Capacitors |
| 5,506,164 | 4/9/96 | Kinoshita et al. | Mitsubishi | Method of Manufacturing a Semiconductor Device having a Cylindrical Capacitor |
| 5,508,218 | 4/16/96 | Jun | LG Semicon | Method for Fabricating a Semiconductor Memory |
| 5,508,222 | 4/16/96 | Sakao | NEC | Fabrication Process for Semiconductor Device |
| 5,516,719 | 5/14/96 | Ryou | Hyundai | Method for the Fabrication of a Capacitor in a Semiconductor Device |
| 5,521,112 | 5/28/96 | Tseng | ITRI | Method of Making Capacitor for Stack Dram Cell |
| 5,529,946 | 6/25/96 | Hong | UMC | Process of Fabricating DRAM Storage Capacitors |
| 5,532,182 | 7/2/96 | Woo | Hyundai | Method for Fabricating Stacked Capacitor of a DRAM Cell |
| 5,534,457 | 7/9/96 | Tseng et al. | ITRI | Method of Forming a Stacked Capacitor with an "I" Shaped Storage Node |
| 5,534,458 | 7/9/96 | Okudaira et al. | Mitsubishi | Method of Manufacturing a Semiconductor Device with High Dielectric Capacitor having Sidewall Spacers |
| 5,536,671 | 7/16/95 | Park | Hyundai | Method for Fabricating Capacitor of a Semiconductor Device |
| 5,539,230 | 7/23/96 | Cronin | IBM | Chimney Capacitor |
| 5,543,345 | 8/6/96 | Liaw et al. | Vanguard | Method for Fabricating Crown Capacitors for a DRAM Cell |
| 5,543,346 | 8/6/96 | Keum et al. | Hyundai | Method of Fabricating a Dynamic Random Access Memory Stacked Capacitor |
| 5,545,582 | 8/13/96 | Roh | Samsung | Method for Manufacturing Semiconductor Device Capacitor |
| 5,545,585 | 8/13/96 | Wang et al. | TSMC | Method of Making a DRAM Circuit with Fin-Shaped Stacked Capacitors |
| 5,547,890 | 8/20/96 | Tseng | Vanguard | DRAM Cell with a Cradle-Type Capacitor |
| 5,550,076 | 8/27/96 | Chen | Vanguard | Method of Manufacture of Coaxial Capacitor for DRAM Memory Cell and Cell Manufactured Thereby |
| 5,550,077 | 8/27/96 | Tseng et al. | Vanguard | DRAM Cell with a Comb-Type Capacitor |
| 5,550,078 | 8/27/96 | Sung | Vanguard | Reduced Mask DRAM Process |
| 5,550,080 | 8/27/96 | Kim | Hyundai | Method for Fabricating Capacitors of Semiconductor Device |
| 5,552,334 | 9/3/96 | Tseng | Vanguard | Method for Fabricating a Y-Shaped Capacitor in a DRAM Cell |
| 5,554,556 | 9/10/96 | Ema | Fujitsu | Method of Making a Semiconductor Memory Device having an Increased Capacitance of Memory Cell |

TABLE 2-continued

| Patent Number | Issue Date | Inventor | Assignee | Title |
|---|---|---|---|---|
| 5,554,557 | 9/10/96 | Koh | Vanguard | Method for Fabricating a Stacked Capacitor with a Self Aligned Node Contact in a Memory Cell |
| 5,556,802 | 9/17/96 | Bakeman, Jr. et al. | IBM | Method of Making Corrugated Vertical Stack Capacitor (CVSTC) |
| 5,561,311 | 10/1/96 | Hamamoto et al. | Toshiba | Semiconductor Memory with Insulation Film Embedded in Groove Formed on Substrate |
| 5,563,088 | 10/8/96 | Tseng | Vanguard | Method for Fabricating a Stacked Capacitor in a DRAM Cell |
| 5,563,089 | 10/8/96 | Jost et al. | Micron | Method of Forming a Bit Line Over Capacitor Array of Memory Cells and an Array of Bit Line Over Capacitor Array of Memory Cells |

As should be clear from the description of FIGS. 5g–5j, the present invention can be applied to any of the processes disclosed in the patents incorporated by reference in Table 2.

As an example, consider the DRAM fabrication method taught in U.S. Pat. No. 5,491,103 (one of the patents incorporated by reference in the list above). This patent teaches a method for manufacturing a capacitor structure of an integrated semiconductor memory device. As disclosed in that patent, a sacrificial material layer is formed on a semiconductor substrate. A first conductive layer is then formed on the sacrificial material layer. A resist layer and an oxide layer are then formed on the first conductive layer and patterned to form a first pattern. A first material layer is formed on the first conductive layer and anisotropically etched to form a spacer on sidewalls of the first pattern. The first conductive layer is then etched using the spacer as an etch-mask and using said sacrificial material layer as an etch end-point. After the first pattern is removed, a second conductive layer is formed on the resultant structure. The second conductive layer can then be anisotropically etched using the sacrificial material layer as the etch end-point. The spacer together with the sacrificial layer are then removed to form a base storage electrode of a capacitor.

The '103 patent then teaches that a dielectric material such as an ONO or tantalum pentoxide can be deposited onto the surface of the storage electrode. These materials, however, have shortcomings. For example, the ONO dielectric has a relatively low dielectric constant compared to materials such as $Ta_2O_5$. The $Ta_2O_5$, however, is difficult to process since the necessary anneal step tends to oxidize the polysilicon storage electrode.

Fortunately, the present invention can easily be implemented to overcome these shortcomings. Specifically, the polysilicon base storage electrode taught in the '103 patent can easily be modified so as to be compatible with high-k dielectrics such as $Ta_2O_5$. As taught herein, a self-aligned reaction can be produced to generate a conductive barrier layer between the storage electrode and the dielectric material. In this context, a self-aligned reaction is meant to encompass any reaction process which creates the conductive barrier layer on the storage electrode without creating a conductor on adjacent insulating regions and without using a patterning step. For example, a silicide layer can be formed by a self-aligned reaction and a conductive nitride formed on the silicide layer.

A similar modification can be made to each of the other incorporated patents listed in Table 2. After the bottom electrode is completed, the self-aligned reaction process can be utilized to create a conductive barrier. At that point, any of the high-k dielectric materials can be used for the capacitor dielectric.

The present invention can also be incorporated in a trench capacitor. A trench capacitor is a capacitor in which one of the electrodes is formed from the semiconductor substrate. The substrate 52 could comprise a semiconductor layer formed over an insulating layer (such as in an SOI device). Alternatively, a stacked capacitor could be formed within a trench. But this embodiment would be implemented as described above.

Figure 6:
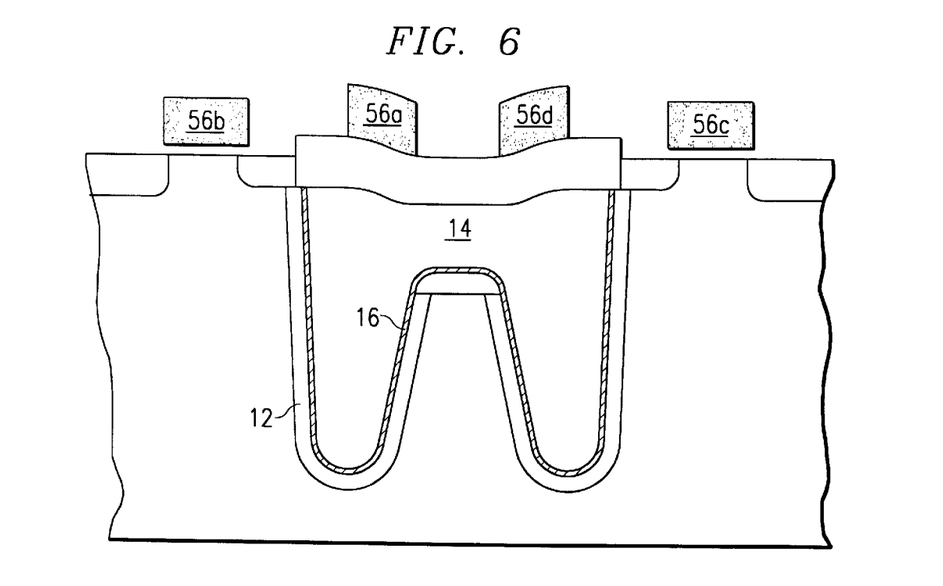
FIG. 6 is a cross-sectional view illustrating the formation of a trench integrated circuit capacitor for a DRAM, according to an alternative embodiment of the present invention.

FIG. 6 illustrates a trench capacitor DRAM which could utilize the novel concepts of the present invention. In this case, the first electrode 12 comprises a multilayer structure as described herein. For example, a silicide layer (not shown) could be formed within the trench using a self-aligned process. A conductive nitride layer (not explicitly shown) could then be formed over the silicide layer. The dielectric 16 and second electrode 14 could then be formed. For details of one specific method of forming a trench capacitor DRAM device can be found in U.S. Pat. No. 5,317,177, incorporated herein by reference.

While described thus far with respect to integrated circuit capacitors, the present invention can also be utilized with other integrated circuit elements. For example, the concepts of the present invention can be applied to metal gate and diffusion and oxidation barrier applications in other integrated circuits such as application specific integrated circuits (ASIC) and logic devices. Metal gates can be formed from materials such as tungsten, titanium, molybdenum/tungsten silicon nitride, titanium silicon nitride, titanium nitride, molybdenum nitride, tantalum silicon nitride, or tantalum nitride. These gates can be formed with or without polysilicon/oxide (gate oxide). Examples of diffusion barrier applications are tungsten silicon nitride, tungsten nitride, titanium silicon nitride, titanium nitride, molybdenum nitride, tantalum silicon nitride, and tantalum nitride.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit capacitor, the method comprising the steps of:
   forming a patterned base electrode over an insulating region;
   then reacting patterned material in the patterned base electrode with a nitrogen-bearing agent to form a self-aligned capacitor electrode with a conductive nitride layer;
   forming a dielectric layer over the self-aligned capacitor electrode containing the conductive nitride layer; and
   forming a second capacitor electrode over the dielectric layer.

2. The method of claim 1 wherein the step of forming a patterned base electrode comprises:
   patterning a layer of polysilicon to form the patterned base electrode over a selected location of the insulating region;
   depositing a layer of a siliciding metal over the patterned base electrode and insulating region;
   reacting the silicided metal with silicon in the patterned base electrode to form a silicide layer over the patterned base electrode; and
   removing portions of the siliciding metal from over the insulating layer.

3. The method of claim 2 wherein the siliciding material is selected from the group consisting of tantalum, titanium, aluminum, tungsten, molybdenum, platinum, palladium, ruthenium, cobalt, and metal alloys.

4. The method of claim 2 wherein the step of reacting the silicided metal with silicon in the patterned base electrode comprises heating in an inert gas ambient.

5. The method of claim 4 wherein said heating step comprises a rapid thermal annealing step.

6. The method of claim 1 wherein said reacting step comprises a rapid thermal anneal in the presence of a nitrogen-bearing gas.

7. The method of claim 1 wherein the step of forming a patterned base electrode comprises:
   patterning a layer of a metal to form the patterned base electrode over a selected location of the insulating region.

8. The method of claim 7 wherein the metal is selected from the group consisting of tungsten, titanium, tantalum, zirconium, ruthenium and molybdenum.

9. The method of claim 7 wherein said reacting step comprises performing a rapid thermal anneal in the presence of a nitrogen-bearing gas.

10. The method of claim 1 wherein said dielectric layer comprises a high dielectric constant material.

11. The method of claim 1 wherein said dielectric layer comprises tantalum pentoxide.

12. The method of claim 1 wherein said dielectric layer comprises lead zirconium titanate.

13. The method of claim 1 wherein said dielectric layer comprises barium strontium titanate.

14. The method of claim 1 wherein said dielectric layer comprises strontium titanate.

15. The method of claim 1 wherein said second capacitor electrode comprises a material selected from the group consisting of titanium nitride, titanium aluminum nitride, tantalum silicide nitride, tantalum silicon nitride, tungsten silicon nitride, tungsten nitride and molybdenum nitride.

* * * * *